US011393645B2

(12) United States Patent
Kraemer et al.

(10) Patent No.: US 11,393,645 B2
(45) Date of Patent: Jul. 19, 2022

(54) ELECTRICAL EQUIPMENT AND ADDITIONAL FUNCTIONAL MODULE ASSOCIATED THEREWITH

(71) Applicant: BERKER GmbH & Co. KG, Schalksmuhle (DE)

(72) Inventors: Jacques Kraemer, Strasbourg (FR); Pascal Noel, Wiwersheim (FR)

(73) Assignee: BERKER GmbH & Co. KG, Schalksmuhle (DE)

( * ) Notice: Subject to any disclaimer, the term of this patent is extended or adjusted under 35 U.S.C. 154(b) by 0 days.

(21) Appl. No.: 16/627,645

(22) PCT Filed: Jul. 10, 2017

(86) PCT No.: PCT/EP2017/067255
§ 371 (c)(1),
(2) Date: Dec. 30, 2019

(87) PCT Pub. No.: WO2019/011403
PCT Pub. Date: Jan. 17, 2019

(65) Prior Publication Data
US 2021/0159033 A1    May 27, 2021

(51) Int. Cl.
*H01H 21/04*      (2006.01)
*H01H 9/16*       (2006.01)
(Continued)

(52) U.S. Cl.
CPC ............ *H01H 21/04* (2013.01); *H01H 9/162* (2013.01); *H01H 9/167* (2013.01);
(Continued)

(58) Field of Classification Search
CPC .... H01H 21/04; H01H 2300/03; H01H 9/162; H01H 9/167; H01H 11/0006;
(Continued)

(56) References Cited

U.S. PATENT DOCUMENTS

| 6,339,798 | B1 * | 1/2002 | Cheron | G05B 19/0426 |
| | | | | 709/220 |
| 2001/0023174 | A1 * | 9/2001 | Charbonnier | H04M 1/725 |
| | | | | 455/41.2 |
| 2008/0271123 | A1 * | 10/2008 | Ollis | G08C 17/02 |
| | | | | 726/4 |
| 2012/0262006 | A1 * | 10/2012 | Elberbaum | H02G 3/12 |
| | | | | 307/112 |

(Continued)

FOREIGN PATENT DOCUMENTS

| DE | 4312613 A1 * | 10/1994 | ............... E06B 9/32 |
| DE | 10318030 | 12/2004 | |

(Continued)

OTHER PUBLICATIONS

International Search Report dated Apr. 17, 2018.

*Primary Examiner* — William H. Mayo, III
*Assistant Examiner* — Rhadames Alonzo Miller
(74) *Attorney, Agent, or Firm* — Ipsilon USA, LLP (57) ABSTRACT

An electrical equipment (1) for an electrical installation suitable is provided, connected to an electrical grid having at least: —a primary functional module (2) suitable and intended for carrying out a current interruption function, and an additional functional module (5) for carrying out at least one function requiring a power supply The function of the additional functional module (5) is selected, alone or in combination, from a function of measuring at least one physical parameter and/or a function of emitting and/or receiving electromagnetic radiation, and/or a display function, and/or an actuation function, and/or a data processing function, and/or a function of converting a physical signal into an electrical signal or vice versa.

33 Claims, 8 Drawing Sheets

(51) Int. Cl.
    *H01H 11/00*     (2006.01)
    *H01H 23/02*     (2006.01)
    *H02B 1/26*     (2006.01)
    *H05B 47/19*     (2020.01)
    *H05K 5/00*     (2006.01)

(52) U.S. Cl.
    CPC ...... *H01H 11/0006* (2013.01); *H01H 23/025* (2013.01); *H02B 1/26* (2013.01); *H05B 47/19* (2020.01); *H05K 5/0004* (2013.01); *H05K 5/0017* (2013.01)

(58) Field of Classification Search
    CPC ...... H01H 23/025; H02G 3/081; H02G 3/086; H02G 3/12; H02G 3/14; H02G 3/16; H04R 3/00; H05B 47/10; H05B 47/19; H05K 5/0017; Y02B 90/20; Y04S 20/14; H02B 1/26

See application file for complete search history.

(56) References Cited

U.S. PATENT DOCUMENTS

| | | | |
|---|---|---|---|
| 2014/0266669 A1* | 9/2014 | Fadell | G08B 19/00 340/501 |
| 2015/0008801 A1* | 1/2015 | Schadlich | H02K 7/116 310/68 B |
| 2017/0242420 A1* | 8/2017 | Mugnier | H04L 9/088 |
| 2018/0106104 A1* | 4/2018 | Carvalheiro | E06B 9/72 |
| 2018/0274943 A1* | 9/2018 | Stocker | G06Q 20/223 |
| 2018/0343139 A1* | 11/2018 | Saxena | G05B 15/02 |

FOREIGN PATENT DOCUMENTS

| | | | |
|---|---|---|---|
| DE | 10318030 A1 * | 12/2004 | ........... H01H 9/0271 |
| EP | 3182435 | 6/2017 | |
| EP | 3182435 A1 * | 6/2017 | ........... H01H 23/025 |

\* cited by examiner

ELECTRICAL EQUIPMENT AND ADDITIONAL FUNCTIONAL MODULE ASSOCIATED THEREWITH

RELATED APPLICATION

This application is a National Phase of PCT/EP2017/067255 filed on Jul. 10, 2017, the entirety of which is incorporated by reference.

BACKGROUND

Field of the Invention

The present invention relates to an electrical apparatus for an electrical installation and to an additional functional module for this electrical apparatus.

DESCRIPTION OF RELATED ART

Document DE 19 21 571 A1 describes an electrical switch comprising a lighting element connected to the electrical circuit of the electrical switch in order to perform an indicator light or permanent lighting function. Such an electrical switch only makes it possible to perform an indicator light or permanent lighting function. This electrical switch therefore does not make it possible to implement more sophisticated functionalities, and is therefore limited.

Objects and Summary

The present invention aims to propose a flexible and customizable solution for an electrical apparatus and to overcome the drawbacks of the prior art.

The present invention relates to an electrical apparatus for an electrical installation, able and intended to be connected to an electrical grid, comprising at least:
  a primary functional module comprising a first connection pole able and intended to be connected to a first line of the electrical grid and a second connection pole able and intended to be connected to a second line of an electrical circuit of the electrical installation and, where applicable, a third connection pole able and intended to be connected to a third neutral line of the electrical grid,
    the primary functional module being able and intended to perform a function of interrupting the current between the first connection pole and the second connection pole and comprises a control member such that, in an open position, an electrical circuit between the first connection pole and the second connection pole is open and that, in a closed position, the electrical circuit is closed,
  an additional functional module comprising means for performing at least one function requiring an electric power supply, comprising at least a fourth connection pole and a fifth connection pole that are electrically connected respectively to the first connection pole and to the second connection pole or, where applicable, to the third connection pole of the primary functional module in order to supply power to the additional functional module,
  a reception module comprising at least a first reception area for receiving the primary functional module,
which electrical apparatus is characterized in that the reception module comprises a second reception area for receiving the additional functional module,
and in that said at least one function of the additional functional module is chosen, alone or in combination, from among a function of measuring at least one physical parameter and/or an electromagnetic radiation transmission and/or reception function and/or a display function and/or an actuation function and/or a data processing function and/or a function of transforming a physical signal into an electrical signal or vice versa.

The invention also relates to an additional functional module for an electrical apparatus as described above, said electrical apparatus comprising a primary functional module and an additional functional module, said additional functional module being characterized in that it corresponds to the additional functional module of said electrical apparatus and comprises at least a fourth connection pole and a fifth connection pole that are able and intended to be electrically connected respectively to the first connection pole and to the second connection pole or, where applicable, to the third connection pole of the primary functional module of the electrical apparatus, in order to supply power to the additional functional module, and comprises means for performing at least one function requiring an electric power supply, and in that said at least one function of the additional functional module is chosen, alone or in combination, from among a function of measuring at least one physical parameter and/or an electromagnetic radiation transmission and/or reception function and/or a display function and/or an actuation function, a data processing function and/or a function of transforming a physical signal into an electrical signal or vice versa.

The invention also relates to an electronic card for an additional functional module as described above, characterized in that the electronic card comprises a measurement sensor and/or display means and/or actuation means and/or electromagnetic wave transmission and/or reception means and/or a transducer and in that it comprises at least first connection means so as to be able and intended to form a removable component of said additional functional module.

BRIEF DESCRIPTION OF THE DRAWINGS

The invention will be better understood by virtue of the following description, which relates to several preferred embodiments that are given by way of non-limiting example and explained with reference to the appended schematic drawings, in which.

DETAILED DESCRIPTION

Figure 2A:
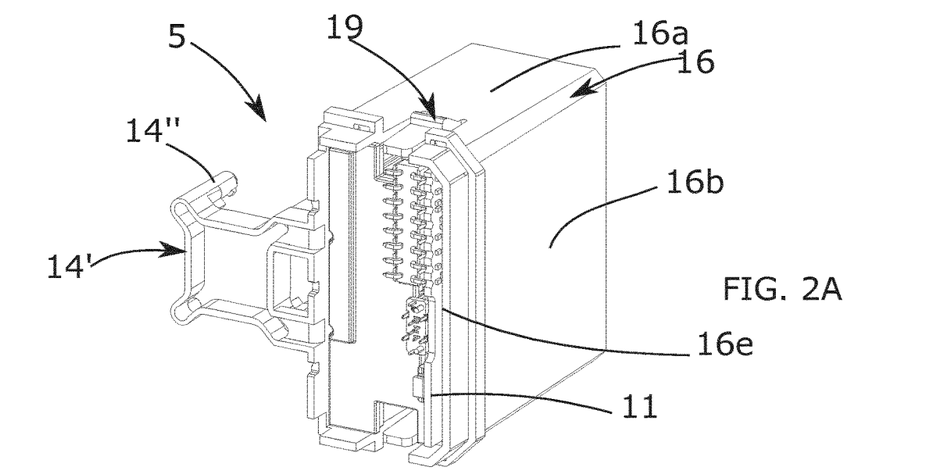
FIG. 2A is a perspective plan view of an additional functional module according to the invention.
Figure 2B:
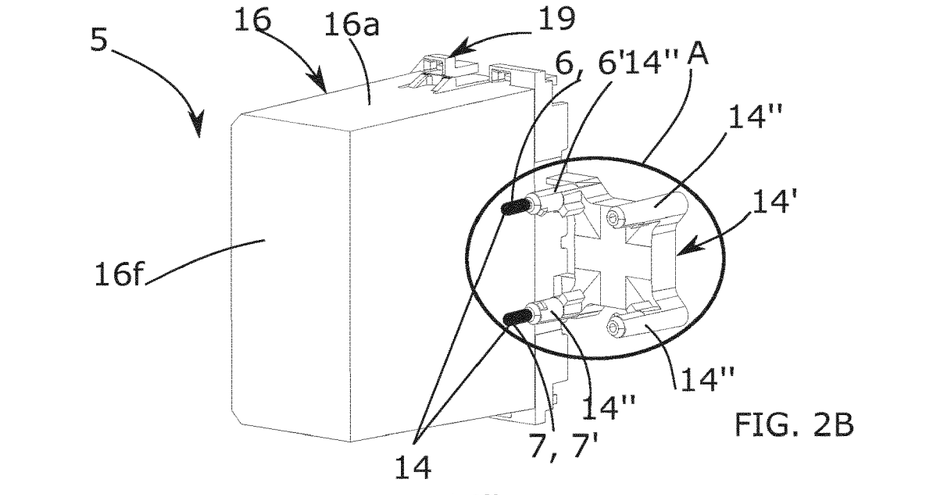
FIG. 2B is a perspective bottom view of the additional functional module shown in FIG. 2A in a variant embodiment of the invention.
Figure 2C:
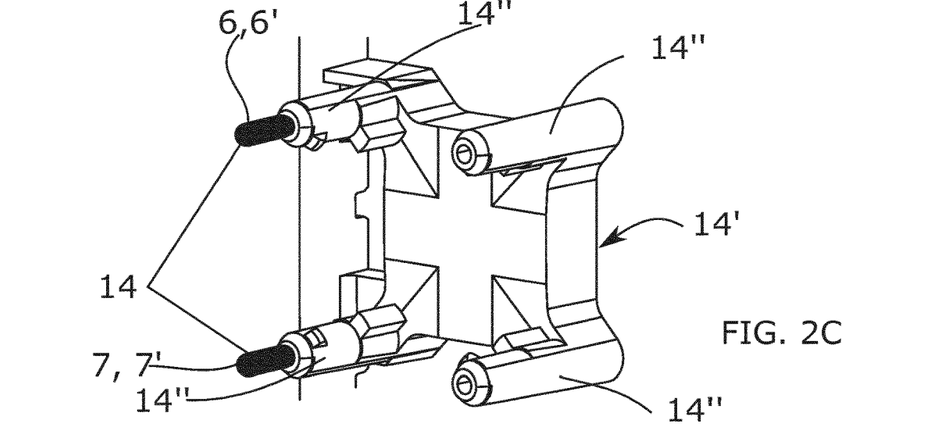
FIG. 2C is a perspective view of the detail A shown in FIG. 2B.
Figure 2D:
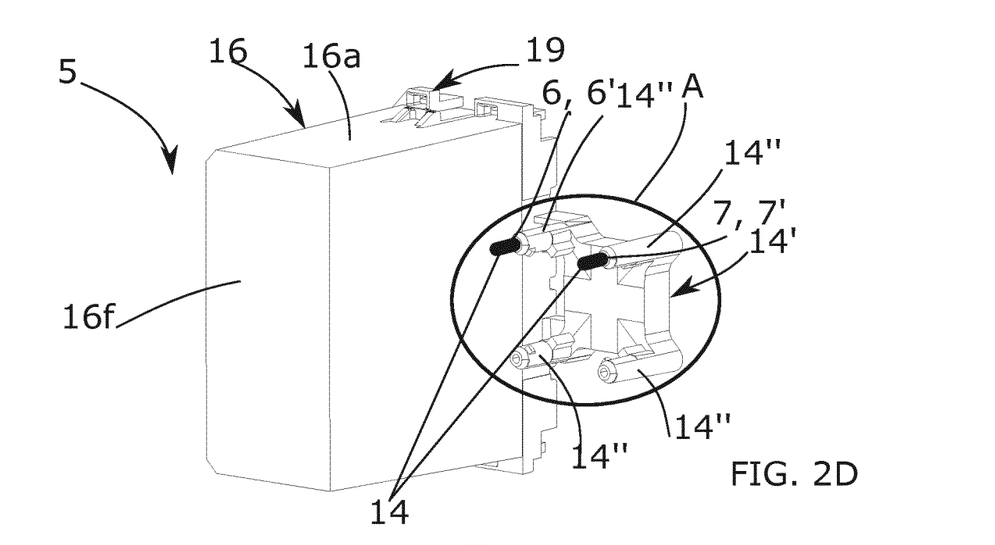
FIG. 2D is a perspective bottom view of the additional functional module in another variant embodiment of the invention.
Figure 2E:
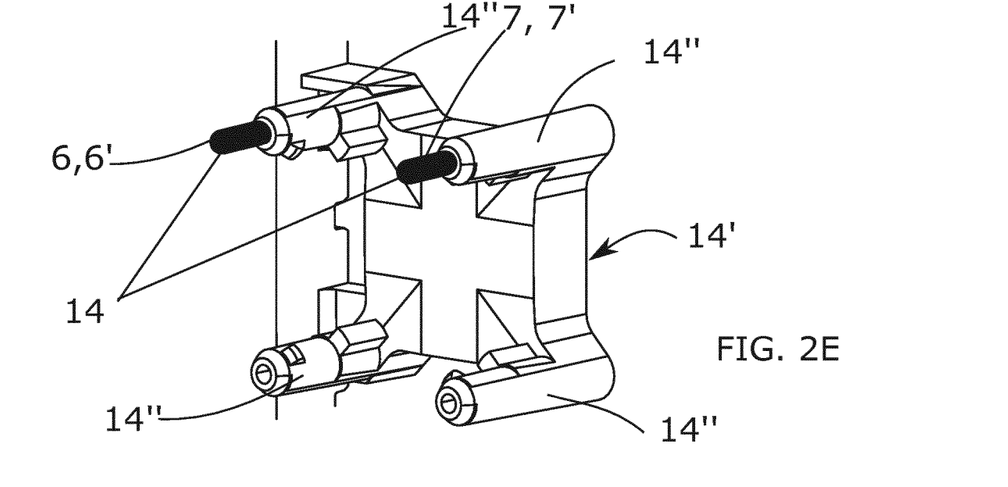
FIG. 2E is a perspective view of the detail A shown in FIG. 2D.
Figure 2F:
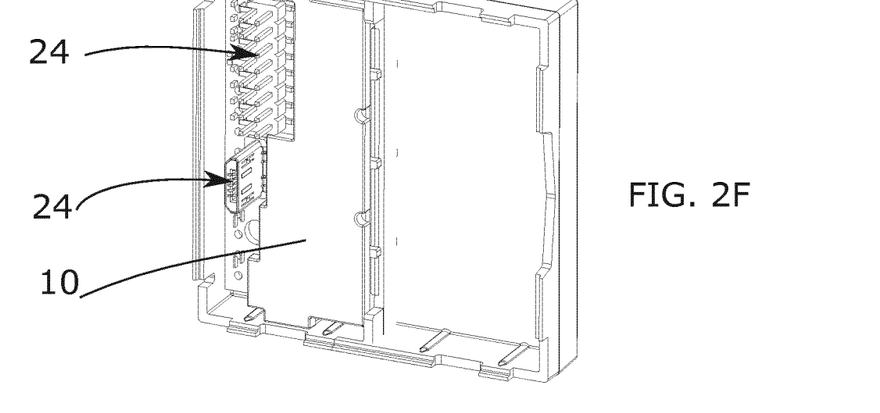
FIG. 2F is a perspective view of a removable electronic card of the additional functional module.
Figure 2G:
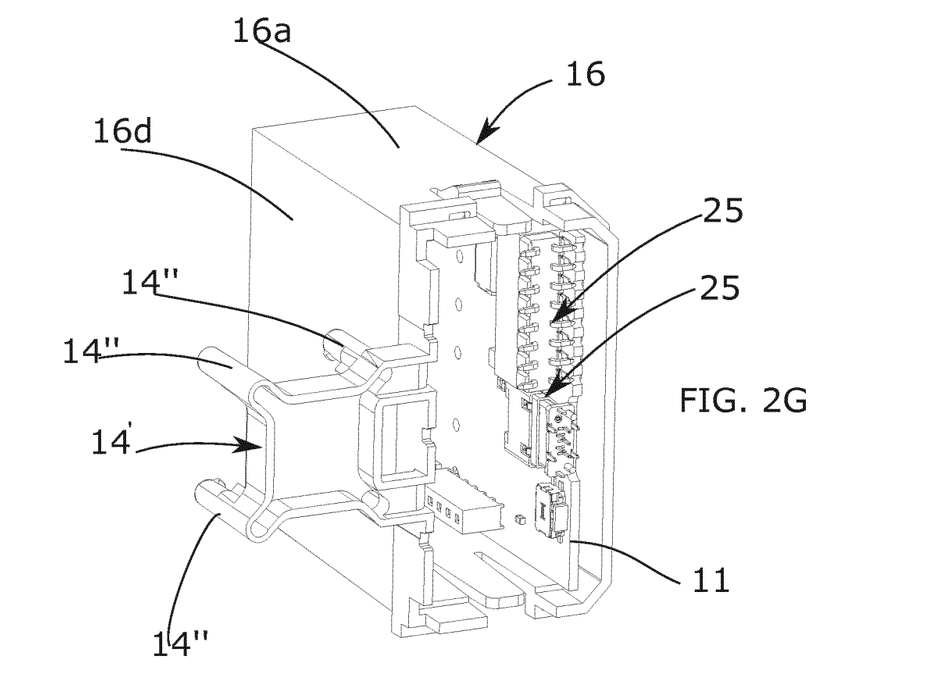
FIG. 2G is a perspective view of the functional module without the removable electronic card.
Figure 3A:
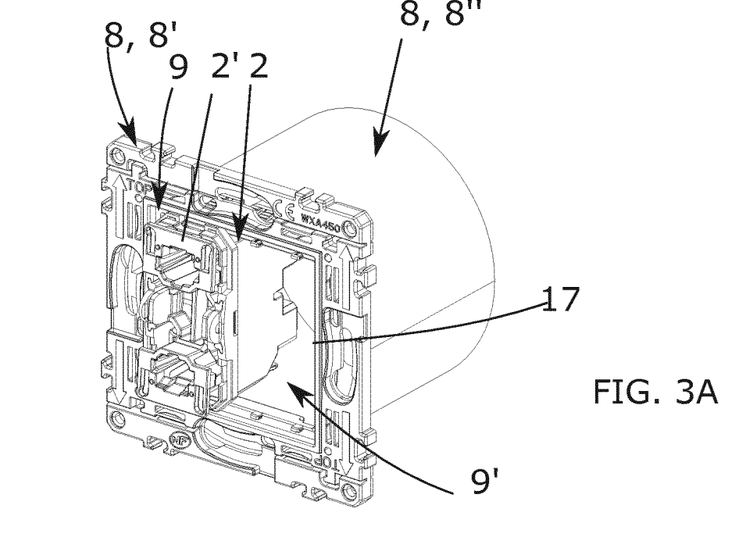
FIG. 3A is a perspective view of the primary functional module according to the invention shown in FIGS. 1A to 1C associated with a support frame of the reception module.
Figure 3B:
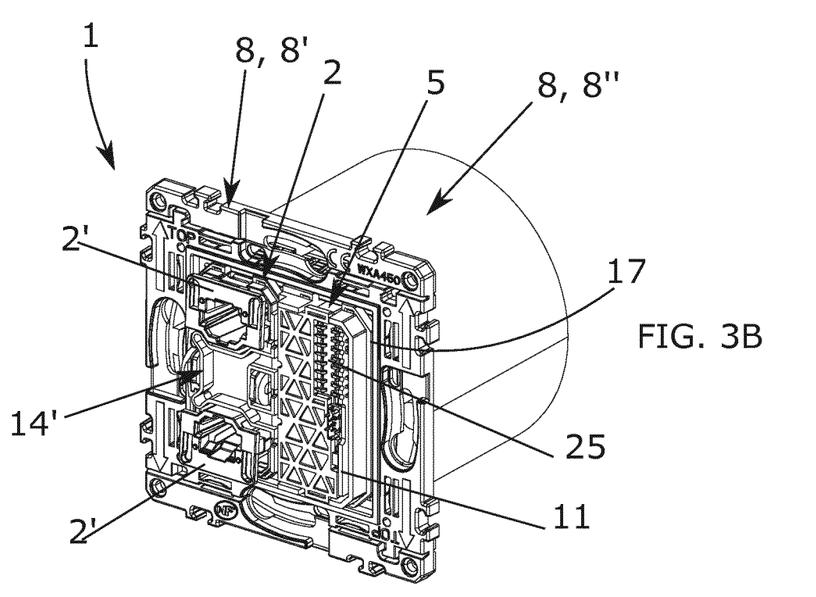
FIG. 3B is a perspective view of the electrical apparatus according to the invention comprising the primary functional module according to the invention shown in FIGS. 1A to 1C and the additional functional module shown in FIGS. 2A to 2G.
Figure 3C:
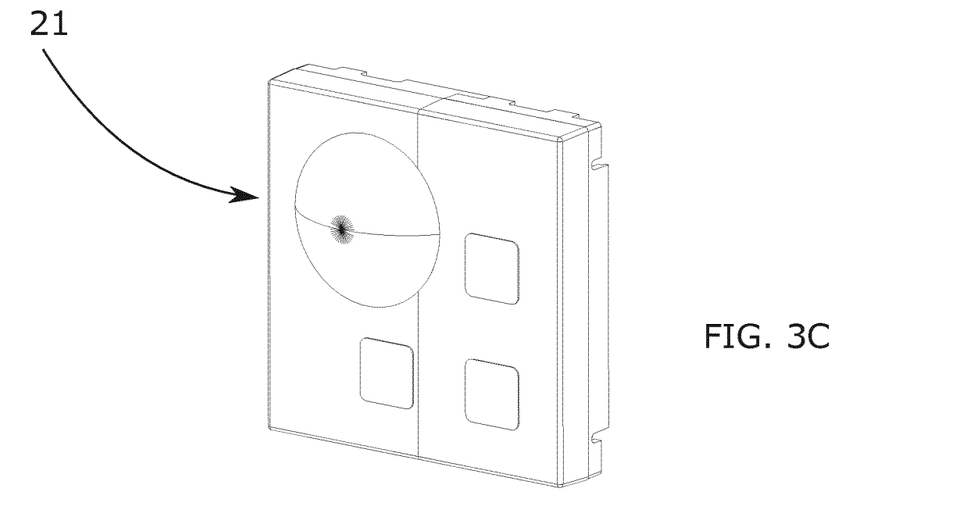
FIG. 3C is a perspective view of a cover plate according to the invention.
Figure 3D:
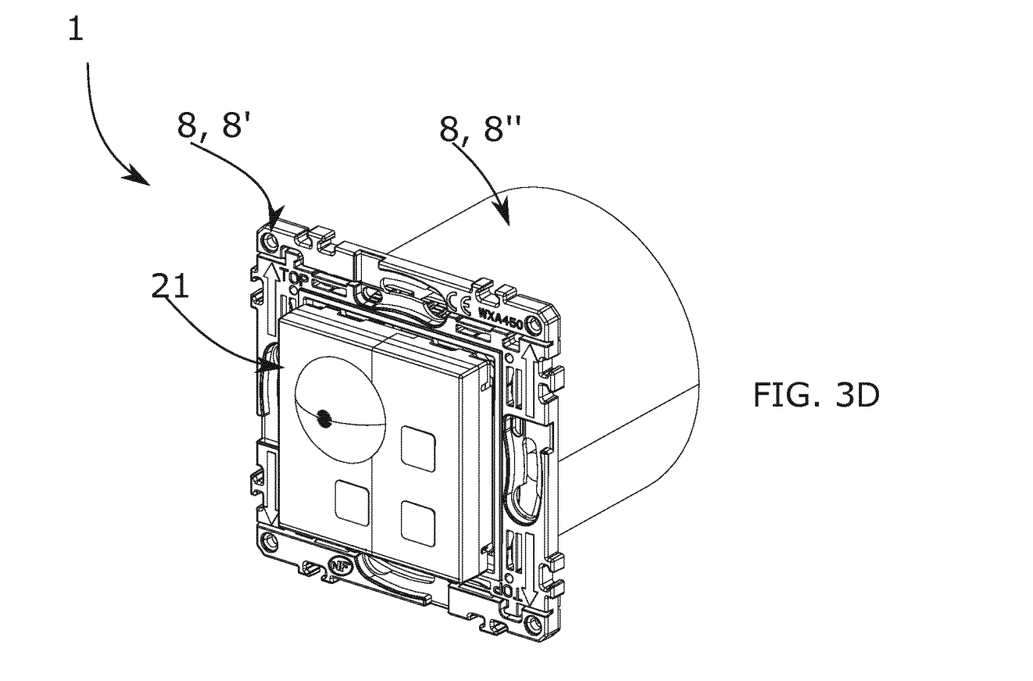
FIG. 3D is a perspective view of the electrical apparatus shown in FIG. 3B and provided with a cover plate shown in FIG. 3C.
Figure 4:
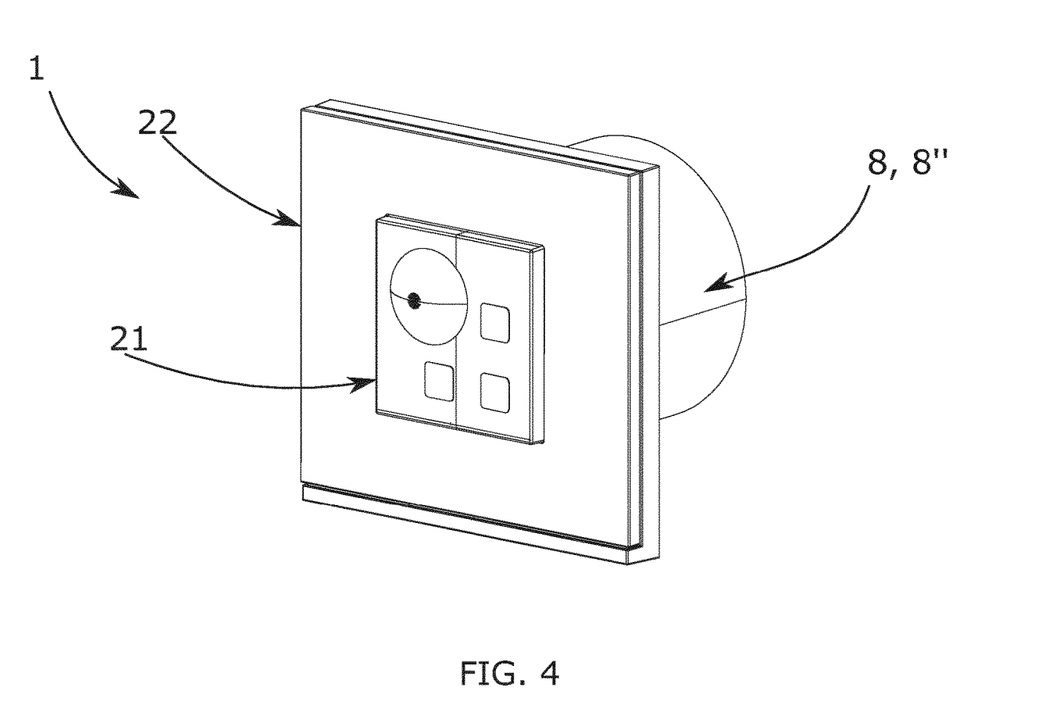
FIG. 4 is a view of the electrical apparatus according to the invention.

The electrical apparatus 1 for an electrical installation, able and intended to be connected to an electrical grid, comprises at least:

a primary functional module 2 comprising a first connection pole 3 able and intended to be connected to a first line L of the electrical grid and a second connection pole 4 able and intended to be connected to a second line L1 of an electrical circuit of the electrical installation and, where applicable, a third connection pole 40 able and intended to be connected to a third neutral line N of the electrical grid (FIG. 1B), the primary functional module 2 (FIGS. 1A and 1C) being able and intended to perform a function of interrupting the current between the first connection pole 3 and the second connection pole 4 and comprises a control member 2' such that, in an open position, an electrical circuit (not shown) between the first connection pole 3 and the second connection pole 4 is open (FIGS. 5 and 6) and that, in a closed position, the electrical circuit is closed, an additional functional module 5 comprising means for performing at least one function requiring an electric power supply, comprising at least a fourth connection pole 6 and a fifth connection pole 7 that are electrically connected respectively to the first connection pole 3 and to the second connection pole 4 or, where applicable, to the third connection pole 40 of the primary functional module 2 in order to supply power to the additional functional module 5 (FIGS. 2A to 2G, 3B, 5 and 6), a reception module 8 comprising at least a first reception area 9 for receiving the primary functional module 2 (FIGS. 3A to 4).

According to the invention, the electrical apparatus 1 is characterized in that the reception module comprises a second reception area 9' for receiving the additional functional module 5 (FIG. 3A), and in that said at least one function of the additional functional module 5 is chosen, alone or in combination, from among a function of measuring at least one physical parameter and/or an electromagnetic radiation transmission and/or reception function and/or a display function and/or an actuation function and/or a data processing function and/or a function of transforming a physical signal into an electrical signal or vice versa.

Advantageously, the electrical apparatus 1 makes it possible to perform, in addition to the function of interrupting the basic current performed by the primary functional module 2, at least one additional function using the additional functional module 5. Such an additional functional module 5 thus allows the electrical apparatus 1 to be customized. Furthermore, as the additional functional module 5 is optional, it is able to be installed or removed at any time without impacting the electrical installation. Specifically, the electrical apparatus 1 is able to operate only with the primary functional module 2. The electrical apparatus 1 that is obtained is thus particularly flexible. Moreover, the additional function of the additional functional module 5 is not intended to inform the user about the location or the state of the interruption function, but advantageously extends to functions independent of the interruption function.

The electrical apparatus 1 is preferably intended to be assembled with or recessed into a support (not shown), such as a wall.

Figure 1A:
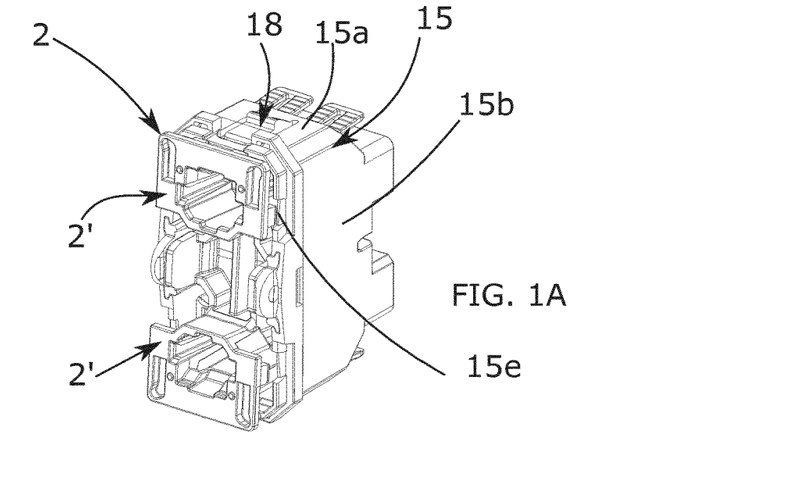
FIG. 1A is a perspective plan view of a primary functional module according to the invention.
Figure 1B:
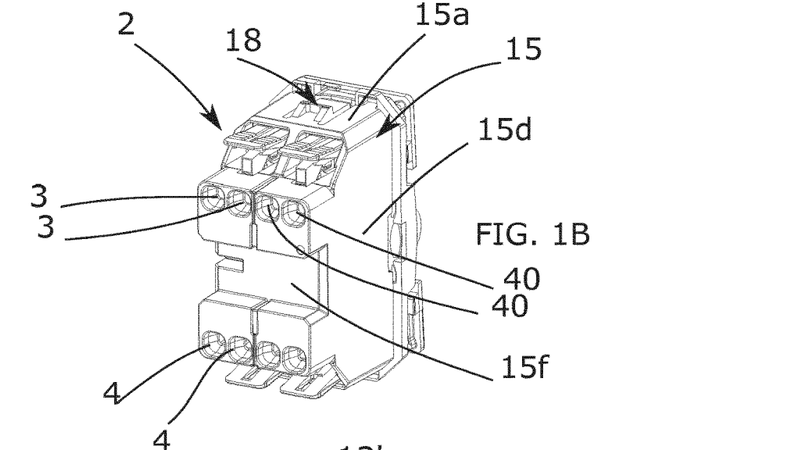
FIG. 1B is a perspective bottom view of the primary functional module shown in FIG. 1A.
Figure 1C:
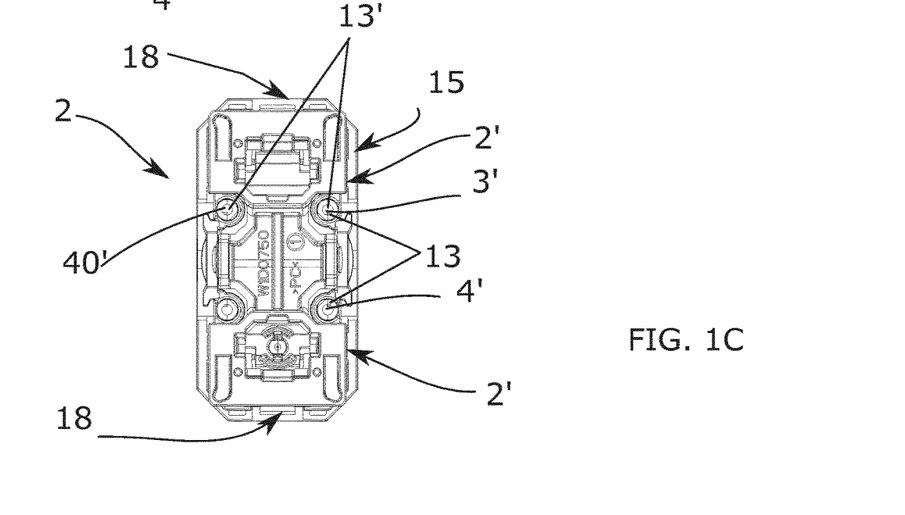
FIG. 1C is a plan view of the primary functional module shown in FIG. 1A.

The primary functional module 2 may be a monostable switch module (not shown) or a bistable switch module (FIGS. 1A to 1C). In the case of a monostable switch module, in the open position, the control member 2' does not act on the opening of the electrical circuit and, in the closed position, the control member 2' may be designed to close the electrical circuit; in this configuration, the monostable switch module is also called "normally open". According to one alternative of a monostable switch module, in the open position, the control member 2' may be designed to open the electrical circuit and, in the closed position, the control member 2' does not act on the closure of the electrical circuit; in this configuration, the monostable switch module is also called "normally closed". The control member 2' of a monostable switch module may preferably be a pushbutton (not shown).

For a bistable switch module, shown in FIGS. 1A to 1C, in the open position, the control member 2' may be designed to open the electrical circuit and, in the closed position, the control member 2' may be designed to close the electrical circuit. In this case, the control member 2' may preferably be a toggle switch that is able to adopt two positions. However, this example is not limiting.

The primary functional module 2 may comprise a first connection pole 3 able and intended to be connected to a first line L of the electrical grid and a second connection pole 4 able and intended to be connected to a second line L1 of an electrical circuit of the electrical installation. In this case, the fourth connection pole 6 and the fifth connection pole 7 are electrically connected respectively to the first connection pole 3 and to the second connection pole 4 (FIG. 5).

Figure 6:
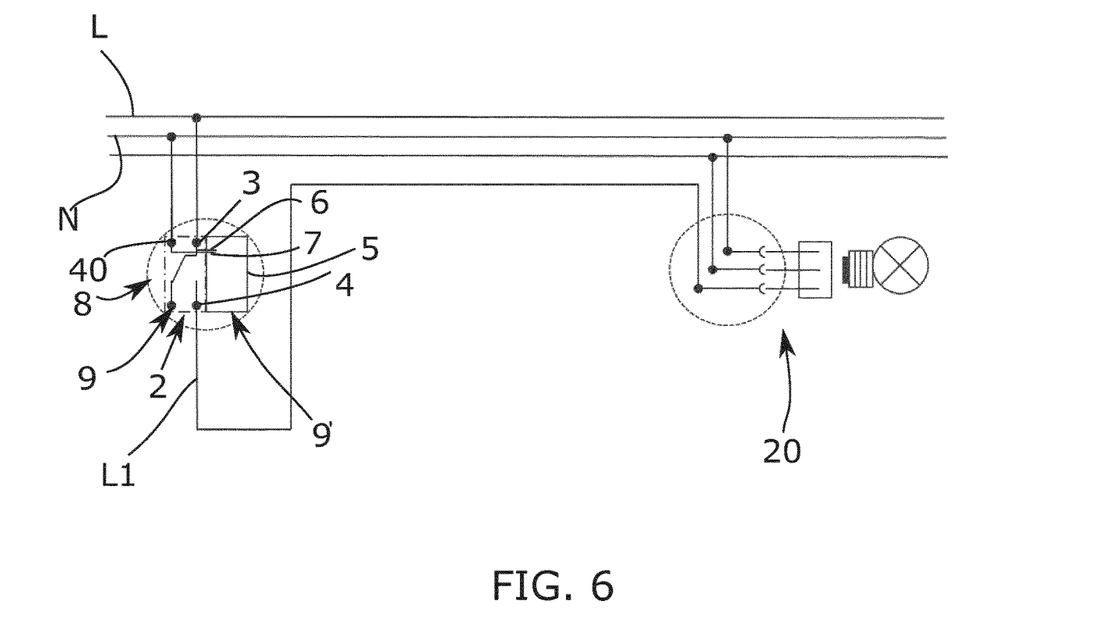
FIG. 6 is a view of a circuit diagram showing the electrical apparatus according to a variant alternative embodiment of the invention installed in an electrical installation.

According to one alternative variant, the primary functional module 2 may comprise a first connection pole 3 able and intended to be connected to a first line L of the electrical grid, a second connection pole 4 able and intended to be connected to a second line L1 of an electrical circuit of the electrical installation and a third connection pole 40 able and intended to be connected to a third neutral line N of the electrical grid (FIG. 6). In this case, the fourth connection pole 6 and the fifth connection pole 7 are electrically connected respectively to the first connection pole 3 and to the third connection pole 40 of the primary functional module 2 in order to supply power to the additional functional module 5.

The first line L may be a power supply line connected to the electrical grid, preferably via a switching device, such as a circuit breaker.

Figure 5:
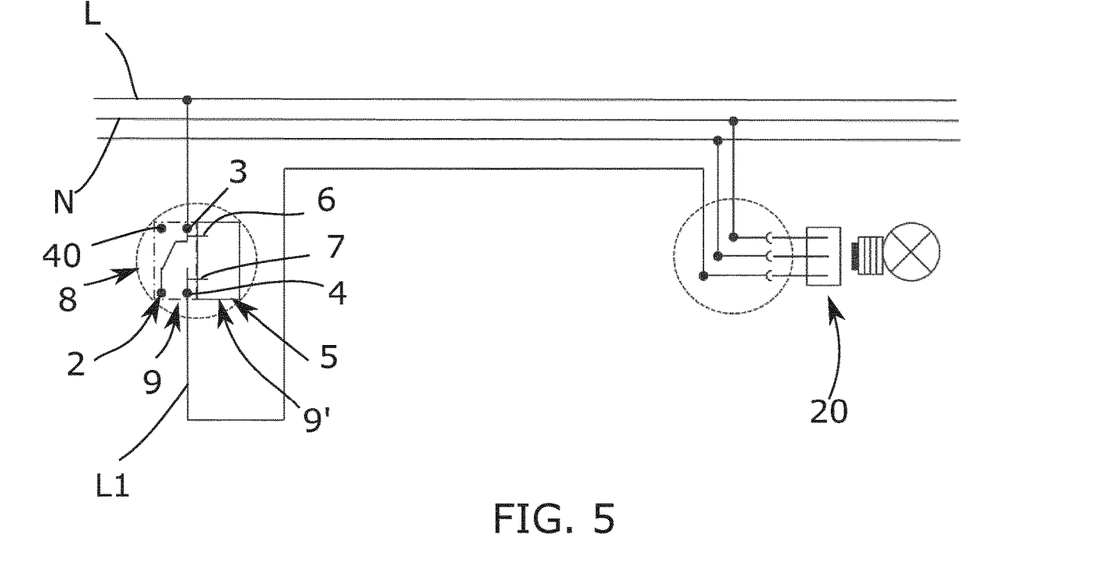
FIG. 5 is a view of a circuit diagram showing the electrical apparatus according to a variant embodiment of the invention installed in an electrical installation.

The second line L1 may be a return line for supplying power to a load 20 of the electrical installation, such as lighting (FIGS. 5 and 6).

The first line L, the second line L1 and the third neutral line N may take the form of one or more cables (not shown).

The electrical installation may preferably be a domestic electrical installation.

Said at least one physical parameter may be temperature, pressure, hygrometry, brightness; these examples are of course nonlimiting.

The electromagnetic radiation transmission and/or reception function may be limited to radiofrequency electromagnetic radiation. This configuration is preferred in particular in order to allow data to be communicated from the electrical apparatus 1 to a control unit (not shown) described below.

The function of the additional functional module 5 may be able and intended to be supplied with power and activated when the control member 2' of the primary functional module 2 is in the open position. This is particularly the case when the fourth connection pole 6 and the fifth connection pole 7 of the additional functional module 5 are electrically connected respectively to the first connection pole 3 and to the second connection pole 4 of the primary functional module 2.

Advantageously, as the additional functional module 5 is connected in parallel with the electrical circuit between the first connection pole 3 and the second connection pole 4 of the primary functional module 2, the means for performing the function of the additional functional module 5 are able to be supplied with power by the electrical grid when the electrical circuit of the primary functional module 2 is open, and therefore when the control member 2' is in the open position. As a result, when the control member 2' is in the open position, the function of the additional functional module 5 is able to be activated. When the control member 2' is in the closed position, the means for performing the function of the additional functional module 5 are short-circuited and are therefore not supplied with power and are deactivated.

The function of the additional functional module 5 may be able and intended to be supplied with power and activated when the control member 2' of the primary functional module 2 is in the open position or when the primary functional module 2 is in the closed position. This is particularly the case when the fourth connection pole 6 and the fifth connection pole 7 of the additional functional module 5 are electrically connected respectively to the first connection pole 3 and to the third connection pole 40.

Advantageously, in this configuration the means for performing the function of the additional functional module 5 are able to be supplied with power by the electrical grid when the electrical circuit of the primary functional module 2 is open and therefore when the control member 2' is in the open position or when the electrical circuit of the primary functional module 2 is closed and therefore when the control member 2' is in the closed position. As a result, when the control member 2' is in the open position or in the closed position, the function of the additional functional module 5 is able to be activated. Therefore, the power supply of the additional functional module 5 is independent of the state of the primary functional module 2.

In any case, the additional functional module 5 may comprise an electrical energy storage and/or production element and the function of the additional functional module 5 may be able and intended to be supplied with power by said electrical energy storage and/or production element.

Advantageously, the means for performing the function of the additional functional module 5 are able to be supplied with power by an electrical energy storage and/or production element, which may be made independent and autonomous in relation to the electrical grid. As a result, the function of the additional functional module 5 is able to be activated independently of the open or closed position of the primary functional module 2. For example, when the control member 2' is in the closed position, the function of the additional functional module 5 is no longer short-circuited and is therefore able to be supplied with power by the electrical energy storage and/or production element and be activated. Furthermore, the function of the additional functional module 5 is able to be activated in the event of disconnection from the electrical grid.

The electrical energy storage and/or production element may be a battery, a capacitor, a piezoelectric generator, a photovoltaic generator, or a thermoelectric generator, for example a Peltier or Seebeck generator.

The additional functional module 5 may comprise at least one measurement sensor able and intended to perform said function of measuring at least one physical parameter.

The measurement sensor may be a temperature sensor, a pressure sensor, a hygrometer, a photodetector, an infrared sensor, a transducer; these examples are of course nonlimiting.

The additional functional module 5 may comprise at least electromagnetic wave transmission and/or reception means able and intended to perform said electromagnetic radiation transmission and/or reception function.

These electromagnetic wave transmission and/or reception means may be a radiofrequency communication element, for example Wi-Fi or Bluetooth, or a repeater. Of course, these examples are not limiting.

Advantageously, these electromagnetic wave transmission and/or reception means make it possible to receive and/or transmit data that may in particular relate to the additional functional module 5. Such electromagnetic wave transmission and/or reception means may, in addition, establish a wireless communication link with a control unit, such as a computer, a smartphone or a digital tablet or to another additional functional module 5 according to the invention and that would also be equipped with electromagnetic wave transmission and/or reception means. It is thus possible to interact remotely with the electrical apparatus 1.

The additional functional module 5 may comprise at least display means able and intended to perform said display function.

Advantageously, these display means make it possible to form a visual interface with a user.

These display means may be a screen.

The additional functional module 5 may comprise at least actuation means able and intended to perform said actuation function.

The actuation means may be an actuator, for example a relay, a solenoid, a micromotor, a piezoelectric mechanism or, in general, any type of means configured so as to transform an electrical quantity into a mechanical quantity or vice versa.

The additional functional module 5 may comprise at least data processing means able and intended to perform said data processing function.

The data processing means may be a microcontroller. These data processing means may, for example, make it possible to process data coming from the measurement sensor.

The additional functional module 5 may comprise at least image-capturing means, for example a camera.

The additional functional module 5 may comprise at least one transducer able and intended to perform said function of transforming a physical signal into an electrical signal or vice versa.

The transducer may be an electroacoustic transducer, such as a speaker or a microphone.

The transducer may be a vibrator or a diffuser.

The additional functional module 5 may comprise at least one electronic card 10, 11 comprising the measurement sensor and/or the electromagnetic wave transmission and/or reception means and/or the display means and/or the actuation means and/or the data processing means and/or the image-capturing means and/or the transducer.

According to one variant embodiment of the invention, a first electronic card 10 may comprise the measurement sensor and/or the display means and/or the electromagnetic wave reception and/or actuation means and/or the transducer and/or image-capturing means and a second electronic card 11 may comprise the electromagnetic wave transmission and/or reception means and/or the data processing means and a third electronic card (not shown) may comprise the electrical energy storage and/or production element.

The first electronic card 10, the second electronic card 11 and the third electronic card may be electrically connected to one another.

The first electronic card 10 may preferably be a removable component of the additional functional module 5.

Advantageously, the function(s) of the additional functional module 5 may thus be modified simply and easily by replacing the first electronic card 10. It is thus not necessary to replace the entire additional functional module 5.

In particular, the first electronic card 10 may comprise at least first connection means 24 complementary with at least second connection means 25 of the second electronic card 11. Said connection means make it possible to electrically and mechanically connect the first electronic card 10 and the second electronic card 11 in a removable and reversible manner (FIGS. 2A and 2F).

The first connection means 24 and the second connection means 25 may consist of a USB connection, by way of non-limiting example.

The primary functional module 2 may comprise at least a first connection terminal 3' electrically connected to the first connection pole 3 and a second connection terminal 4' electrically connected to the second connection pole 4, and the first connection terminal 3' and the second connection terminal 4' may form a first outlet 13 (FIG. 1C).

According to one alternative possibility, said primary functional module 2 may comprise at least a first conductive wire connected (not shown) to the first connection pole 3 and a second conductive wire (not shown) connected to the second connection pole 4, the first conductive wire and the second conductive wire being able to be connected to a terminal block (not shown) of the additional functional module 5.

Alternatively, the primary functional module 2 may comprise at least a first connection terminal 3' electrically connected to the first connection pole 3 and a third connection terminal 40' electrically connected to the third connection pole 40 and the first connection terminal 3' and the third connection terminal 40' may form a first outlet 13' (FIG. 1C).

According to one alternative possibility, said primary functional module 2 may comprise at least a first conductive wire connected (not shown) to the first connection pole 3 and a third conductive wire (not shown) connected to the third connection pole 40, the first conductive wire and the third conductive wire being able to be connected to a terminal block (not shown) of the additional functional module 5.

The additional functional module 5 may comprise at least a fourth connection terminal 6' electrically connected to the fourth connection pole 6 and a fifth connection terminal 7' electrically connected to the fifth connection pole 7 and the fourth connection terminal 6' and the fifth connection terminal 7' may form a second outlet 14 (FIGS. 2B, 2C, 2D and 2E).

According to one alternative possibility, said additional functional module 5 may comprise a terminal block (not shown) electrically connected to the fourth connection pole 6 and to the fifth connection pole 7. The first conductive wire and the second conductive wire or, where applicable, the third conductive wire of the primary functional module 2 may be connected to the terminal block.

The first outlet 13, 13' of the primary functional module 2 and the second outlet 14 of the additional functional module 5 may have complementary shapes so as to be connected and so as to electrically and mechanically connect the first connection terminal 3' to the fourth connection terminal 6' and so as to electrically and mechanically connect the second connection terminal 4' to the fifth connection terminal 7' (FIGS. 1C, 2B, 2C, 3B, 5) or so as to electrically and mechanically connect the third connection terminal 40' to the fifth connection terminal 7' (FIGS. 1C, 2B, 2C, 3B, 6).

The first connection terminal 3' and the second connection terminal 4' or, where applicable, the third connection terminal 40', may be respectively a first female terminal and a second female terminal, for example taking the form of a cavity provided with electrical contact. In this case, the first outlet 13, 13' is a socket. This first outlet 13, 13' may preferably comprise two cavities distributed along one side of a square (FIG. 1C).

The first socket outlet 13, 13' may preferably have a protection rating whose degree of protection against solids is between 0 and 6 and whose degree of protection against liquids is between 0 and 8. For example, the protection rating may be equal to IP2X, X being a value between 0 and 8.

The fourth connection terminal 6' and the fifth connection terminal 7' may be respectively a fourth male terminal and a fifth male terminal, for example taking the form of a rod. In this case, the second outlet 14 is a plug. The second outlet 14 may comprise a base 14' from which the fourth connection terminal 6' and the fifth connection terminal 7' in the form of a rod extend. The base 14' preferably has a substantially square shape with rounded corners from which four pads 14'' extending substantially orthogonal to the base 14' extend. These pads 14'' form a mechanical joint with the first socket outlet 13, 13', these pads 14'' being able to fit into the cavities. Two of these pads 14'' may support the two rods forming the fourth connection terminal 6' and the fifth connection terminal 7' (FIGS. 2A, 2B, 2C, 2E).

The primary functional module 2 may comprise a first housing 15 with which the first outlet 13, 13' and the control member 2' are assembled (FIGS. 1A, 1B, 1C).

The first housing 15 makes it possible to protect the primary functional module 2.

The first housing 15 may be made from polymer material.

The first housing 15 may comprise four lateral faces 15a, 15b, 15d, a front opening 15e, and a rear face 15f. The first housing 15 may have a substantially rectangular cross section.

The first outlet 13, 13' and the control member 2' preferably cover the front opening 15e. As a result, the first outlet 13, 13' is advantageously accessible from the front of the primary functional module 2, thereby facilitating interlocking with the second outlet 14 of the additional functional module 5.

The additional functional module 5 may comprise a second housing 16 in which said at least one electronic card 10, 11 comprising the measurement sensor and/or the electromagnetic wave transmission and/or reception means and/or the display means and/or the actuation means and/or the data processing means and/or the transducer is housed.

The second housing 16 makes it possible to protect the additional functional module 5 (FIGS. 2A and 2B).

The second outlet 14 of the additional functional module 5 may project from the second housing 16 of the additional functional module 5.

The second housing 16 may be made from polymer material.

The second housing 16 may comprise four lateral faces 16a, 16b, 16d, a front opening 16e, and a rear face 16f. The second housing 16 may have a substantially rectangular cross section.

Preferably, the base 14' of the second outlet 14 may extend in the plane of the front opening 16e and the pads 14" may extend in the direction of the lateral faces 16a, 16b, 16d.

The second housing 16, the base 14' and the pads 14" may form a single one-piece component, which is for example molded.

Alternatively, the second outlet 14 may be a removable element (not shown) of the second housing 16. More particularly, the base 14' may be mechanically connected to the second housing 16 removably and reversibly by mechanical connection means (not shown). The base 14' may furthermore comprise electrical connection means (not shown) electrically connected to the fourth connection terminal 6' and to the fifth connection terminal 7' and complementary with electrical connection means (not shown) arranged on the second housing 16. These electrical connection means of the second housing 16 may consist of a terminal block.

One of the lateral faces 15b of the first housing 15 may be adjacent to one of the lateral faces 16d of the second housing 16, more particularly these lateral faces 15b, 16d may be contiguous and facing one another. These contiguous lateral faces 15b, 16d may comprise guide means (not shown) in order to facilitate the positioning of the first and second housings 15, 16 with respect to one another.

The first electronic card 10 may cover the front opening 16e.

Advantageously, due to this configuration, the first electronic card 10 is easily accessible and may easily be secured/detached to/from the second electronic card 11 in order to be replaced.

The reception module 8 may comprise a support frame 8' comprising a central opening 17 at least partly forming said first and second reception areas 9, 9' receiving the first housing 15 (FIGS. 3A, 3B, 3D) and the second housing 16, and the first housing 15 and the second housing 16 may respectively comprise removable fastening means 18, 19 interacting with the support frame 8' (FIGS. 1A, 1B, 2A, 2B).

The fastening means 18, 19 respectively of the first housing 15 and of the second housing 16 may preferably consist of two tabs projecting respectively from two of the opposing lateral faces 15a; 16a (FIGS. 1A, 1B, 1C, 2A, 2B and 2D).

The reception module 8 may also comprise a recessed housing 8" to which the support frame 8' is able to be fastened by fastening means (not shown) (FIGS. 3A, 3B, 3D, 4). This recessed housing 8" may be intended to be recessed into a support, such as a wall.

The recessed housing 8" may comprise a receptacle for receiving the four lateral faces 15a, 15b, 15d and the rear face 15f of the first housing 15 and the four lateral faces 16a, 16b, 16d and the rear face 16f of the second housing 16.

The control member 2', the base 14' of the second outlet 14 and the first electronic card 10 may be covered with at least one cover plate 21 comprising or not comprising at least one button (not shown) which allows the control member of the primary functional module 2 to be actuated (FIGS. 3C, 3D, 4).

The cover plate 21 simultaneously plays the role of an interface with the user and may also have an esthetic function and a protective function.

The cover plate 21 may also make it possible to block off the control member 2', which is no longer able to be actuated in this case.

The support frame 8' may be covered with a covering frame 22.

The additional functional module 5 is suitable and intended for an electrical apparatus 1 as described above, said electrical apparatus comprising a primary functional module 2 and an additional functional module 5.

According to the invention, said additional functional module 5 is characterized in that it corresponds to the additional functional module 5 of said electrical apparatus 1 and comprises at least a fourth connection pole 6 and a fifth connection pole 7 that are able and intended to be electrically connected respectively to the first connection pole 3 and to the second connection pole 4 or, where applicable, to the third connection pole 40 of the primary functional module 2 of the electrical apparatus 1, in order to supply power to the additional functional module 5, and comprises means for performing at least one function requiring an electric power supply, and in that said at least one function of the additional functional module 5 is chosen, alone or in combination, from among a function of measuring at least one physical parameter and/or an electromagnetic radiation transmission and/or reception function and/or a display function and/or an actuation function, a data processing function and/or a function of transforming a physical signal into an electrical signal or vice versa.

Said at least one physical parameter may be as described above.

The function of the additional functional module 5 may be able and intended to be supplied with power and activated when the control member 2' of the primary functional module 2 is in the open position or, where applicable, when the control member 2' of the primary functional module 2 is in the closed position.

The additional functional module 5 may comprise an electrical energy storage and/or production element and the function of the additional functional module 5 may be able and intended to be supplied with power by said electrical energy storage and/or production element.

Said electrical energy storage and/or production element may be as described above.

The additional functional module 5 may comprise at least one measurement sensor able and intended to perform said function of measuring at least one physical parameter.

The measurement sensor may be as described above.

The additional functional module 5 may comprise at least electromagnetic wave transmission and/or reception means able and intended to perform said electromagnetic radiation transmission and/or reception function.

The electromagnetic wave transmission and/or reception means may be as described above.

The additional functional module 5 may comprise at least display means able and intended to perform said display function.

The display means may be as described above.

The additional functional module 5 may comprise at least actuation means able and intended to perform said actuation function.

The actuation means may be as described above.

The additional functional module 5 may comprise at least data processing means able and intended to perform said data processing function.

The processing means may be as described above.

The additional functional module 5 may comprise at least image-capturing means, for example a camera.

The additional functional module 5 may comprise at least one transducer able and intended to perform said function of transforming a physical signal into an electrical signal or vice versa, as described above.

The additional functional module 5 may comprise at least one electronic card 10, 11 comprising the measurement sensor and/or the electromagnetic wave transmission and/or reception means and/or the display means and/or the actuation means and/or the data processing means.

The additional functional module 5 may comprise a second housing 16 in which said at least one electronic card 10, 11 comprising the measurement sensor and/or the electromagnetic wave transmission and/or reception means and/or the display means and/or the actuation means and/or the data processing means is housed.

The additional functional module 5 may comprise a first electronic card 10, a second electronic card 11 and a third electronic card, as described above.

The second housing 16 may be as described above.

The additional functional module 5 may comprise at least a fourth connection terminal 6' electrically connected to the fourth connection pole 6 and a fifth connection terminal 7' electrically connected to the fifth connection pole 7, and the fourth connection terminal 6' and the fifth connection terminal 7' may form a second outlet 14.

According to one alternative possibility, said additional functional module 5 may comprise a terminal block (not shown) electrically connected to the fourth connection pole 6 and to the fifth connection pole 7. The first conductive wire and the second conductive wire or, where applicable, the third conductive wire of the primary functional module 2 may be connected to the terminal block.

The second outlet 14 of the additional functional module 5 may project from the second housing 16 of the additional functional module 5.

The second outlet 14 may be as described above.

The second housing 16 may comprise removable fastening means 18, 19 able and intended to interact with a support frame 8' of the electrical apparatus 1. These fastening means 18, 19 may be as described above.

The invention also relates to an electronic card 10 for an additional functional module 5 as described above.

According to the invention, the electronic card 10 is characterized in that it comprises a measurement sensor and/or display means and/or actuation means and in that it comprises at least first connection means 24 so as to be able and intended to form a removable component of said additional functional module 5.

This electronic card corresponds to the first electronic card 10 as described above.

Of course, the invention is not limited to the embodiments that are described and shown in the appended drawings. Modifications remain possible, particularly from the point of view of the composition of the various elements or by substituting technical equivalents, without otherwise departing from the scope of protection of the invention.

The invention claimed is:

1. An electrical apparatus for an electrical installation, able to be connected to an electrical grid, comprising at least:
  a primary functional module comprising a first connection pole able to be connected to a first line of the electrical grid and a second connection pole able to be connected to a second line of an electrical circuit of the electrical installation and, where applicable, a third connection pole able to be connected to a third neutral line of the electrical grid,
  the primary functional module being able to perform a function of interrupting the current between the first connection pole and the second connection pole and comprises a control member such that, in an open position, an electrical circuit between the first connection pole and the second connection pole is open and that, in a closed position, the electrical circuit is closed,
  an additional functional module comprising means for performing at least one function requiring an electric power supply, comprising at least a fourth connection pole and a fifth connection pole that are electrically connected respectively to the first connection pole and to the second connection pole or, where applicable, to the third connection pole of the primary functional module in order to supply power to the additional functional module,
  a reception module comprising at least a first reception area for receiving the primary functional module, wherein said reception module comprises a second reception area for receiving the additional functional module,
  and in that said at least one function of the additional functional module is chosen, alone or in combination, from among a function of measuring at least one physical parameter and/or an electromagnetic radiation transmission and/or reception function and/or a display function and/or an actuation function and/or a data processing function and/or a function of transforming a physical signal into an electrical signal or vice versa.

2. The electrical apparatus as claimed in claim 1, wherein the function of the additional functional module is able to be supplied with power and activated when the control member of the primary functional module is in the open position or, where applicable, when the control member of the primary functional module is in the closed position.

3. The electrical apparatus as claimed in claim 1, wherein the additional functional module comprises an electrical energy storage and/or production element and in that the function of the additional functional module is able to be supplied with power by said electrical energy storage and/or production element.

4. The electrical apparatus as claimed in claim 1, wherein the additional functional module comprises at least one measurement sensor able to perform said function of measuring at least one physical parameter.

5. The electrical apparatus as claimed in claim 1, wherein the additional functional module comprises at least electromagnetic wave transmission and/or reception means able to perform said electromagnetic radiation transmission and/or reception function.

6. The electrical apparatus as claimed in claim 1, wherein the additional functional module comprises at least display means able and intended to perform said display function.

7. The electrical apparatus as claimed in claim 1, wherein the additional functional module comprises at least actuation means able to perform said actuation function.

8. The electrical apparatus as claimed in claim 1, wherein the additional functional module comprises at least data processing means able to perform said data processing function.

9. The electrical apparatus as claimed in claim 4, wherein the additional functional module comprises at least one electronic card comprising the measurement sensor and/or the electromagnetic wave transmission and/or reception means and/or the display means and/or the actuation means and/or the data processing means.

10. The electrical apparatus as claimed in claim 1, wherein the primary functional module comprises at least a first connection terminal electrically connected to the first connection pole and a second connection terminal electrically connected to the second connection pole and in that the first connection terminal and the second connection terminal form a first outlet, or the primary functional module comprises at least a first connection terminal electrically connected to the first connection pole and a third connection terminal electrically connected to the third connection pole and the first connection terminal and the third connection terminal may form a first outlet.

11. The electrical apparatus as claimed in claim 1, wherein the additional functional module comprises at least a fourth connection terminal electrically connected to the fourth connection pole and a fifth connection terminal electrically connected to the fifth connection pole and in that the fourth connection terminal and the fifth connection terminal form a second outlet.

12. The electrical apparatus as claimed in claim 10, wherein the first outlet of the primary functional module and the second outlet of the additional functional module have complementary shapes so as to be connected and so as to electrically and mechanically connect the first connection terminal to the fourth connection terminal and so as to electrically and mechanically connect the second connection terminal to the fifth connection terminal or so as to electrically and mechanically connect the third connection terminal to the fifth connection terminal.

13. The electrical apparatus as claimed in claim 10, wherein the primary functional module comprises a first housing with which the first outlet and the control member are assembled.

14. The electrical apparatus as claimed in claim 9, wherein the additional functional module comprises a second housing in which said at least one electronic card comprising the measurement sensor and/or the electromagnetic wave transmission and/or reception means and/or the display means and/or the actuation means and/or the data processing means and/or a transducer is housed.

15. The electrical apparatus as claimed in claim 14, wherein the second outlet of the additional functional module projects from the second housing of the additional functional module.

16. The electrical apparatus as claimed in claim 13, wherein the reception module may comprise a support frame comprising a central opening at least partly forming said first and second reception areas receiving the first housing and the second housing and in that the first housing and the second housing respectively comprise removable fastening means interacting with the support frame.

17. An additional functional module for an electrical apparatus as claimed in claim 1, said electrical apparatus comprising a primary functional module and an additional functional module, said additional functional module corresponds to the additional functional module of said electrical apparatus and comprises at least a fourth connection pole and a fifth connection pole able to be electrically connected respectively to the first connection pole and to the second connection pole or, where applicable, to the third connection pole of the primary functional module of the electrical apparatus, in order to supply power to the additional functional module, and comprises means for performing at least one function requiring an electric power supply, and in that said at least one function of the additional functional module is chosen, alone or in combination, from among a function of measuring at least one physical parameter and/or an electromagnetic radiation transmission and/or reception function and/or a display function and/or an actuation function, a data processing function and/or a function of transforming a physical signal into an electrical signal or vice versa.

18. The module as claimed in claim 17, wherein the function of the additional functional module is able to be supplied with power and activated when the control member of the primary functional module is in the open position.

19. The module as claimed in claim 17, wherein said module comprises an electrical energy storage and/or production element and in that the function of the additional functional module is able to be supplied with power by said electrical energy storage and/or production element.

20. The module as claimed in claim 17, wherein the module comprises at least one measurement sensor able to perform said function of measuring at least one physical parameter.

21. The module as claimed in claim 17, wherein said module comprises at least electromagnetic wave transmission and/or reception means able to perform said electromagnetic radiation transmission and/or reception function.

22. The module as claimed in claim 17, wherein said module comprises at least display means able to perform said display function.

23. The module as claimed in claim 17, wherein said module comprises at least actuation means able to perform said actuation function.

24. The module as claimed in claim 17, wherein said module comprises at least data processing means able to perform said data processing function.

25. The module as claimed in claim 20, wherein said module comprises at least one electronic card comprising the measurement sensor and/or the electromagnetic wave transmission and/or reception means and/or the display means and/or the actuation means and/or the data processing means and/or a transducer.

26. The module as claimed in claim 25, wherein a first electronic card comprises the measurement sensor and/or the display means and/or the actuation means and/or the electromagnetic wave transmission and/or reception means and/or a transducer and a second electronic card comprises the electromagnetic wave transmission and/or reception means and/or the data processing means and a third electronic card comprises the electrical energy storage and/or production element.

27. The module as claimed in claim 26, wherein the first electronic card is a removable component of said additional functional module.

28. The module as claimed in claim 27, wherein the first electronic card comprises at least first connection means complementary with at least second connection means of the second electronic card.

29. The module as claimed in claim 25, wherein said modules comprises a second housing in which said at least one electronic card comprising the measurement sensor and/or the electromagnetic wave transmission and/or reception means and/or the display means and/or the actuation means and/or the data processing means is housed.

30. The module as claimed in claim 17, wherein said module comprises at least a fourth connection terminal connected to the fourth connection pole and a fifth connection terminal connected to the fifth connection pole and in that the fourth connection terminal and the fifth connection terminal form a second outlet.

31. The module as claimed in claim 29, wherein the second outlet of the additional functional module projects from the second housing of the additional functional module.

32. The module as claimed in claim 29, wherein the second housing comprises removable fastening means able to interact with a support frame of the electrical apparatus.

33. An electronic card for an additional functional module as claimed in claim 17, wherein the electronic card comprises a measurement sensor and/or display means and/or actuation means and/or electromagnetic wave transmission and/or reception means and/or a transducer and in that it comprises at least first connection means so as to be able to form a removable component of said additional functional module.

* * * * *